(12) United States Patent
Liu et al.

(10) Patent No.: US 11,431,349 B2
(45) Date of Patent: Aug. 30, 2022

(54) METHOD, ELECTRONIC DEVICE AND COMPUTER PROGRAM PRODUCT FOR PROCESSING DATA

(71) Applicant: EMC IP Holding Company LLC, Hopkinton, MA (US)

(72) Inventors: Bing Liu, Tianjin (CN); Tao Chen, Beijing (CN)

(73) Assignee: EMC IP Holding Company LLC, Hopkinton, MA (US)

(*) Notice: Subject to any disclaimer, the term of this patent is extended or adjusted under 35 U.S.C. 154(b) by 316 days.

(21) Appl. No.: 16/862,984

(22) Filed: Apr. 30, 2020

(65) Prior Publication Data

US 2021/0135683 A1  May 6, 2021

(30) Foreign Application Priority Data

Oct. 31, 2019 (CN) .......................... 201911052498.5

(51) Int. Cl.
*H03M 7/30* (2006.01)
*G06F 3/06* (2006.01)
*G06F 9/50* (2006.01)
*H04L 69/04* (2022.01)
*G06F 11/14* (2006.01)
*G06F 16/174* (2019.01)

(52) U.S. Cl.
CPC ............ *H03M 7/30* (2013.01); *G06F 3/0608* (2013.01); *G06F 9/5077* (2013.01); *H04L 69/04* (2013.01); *G06F 2212/401* (2013.01)

(58) Field of Classification Search
CPC ...... H03M 7/30; G06F 3/0608; G06F 9/5077; G06F 2212/401; G06F 11/1458; H04L 69/04

See application file for complete search history.

(56) References Cited

U.S. PATENT DOCUMENTS

| | | | |
|---|---|---|---|
| 11,119,668 B1* | 9/2021 | Keller | ...................... G06F 3/064 |
| 2011/0199243 A1* | 8/2011 | Fallon | .................... G06Q 40/04 |
| | | | 341/60 |
| 2014/0101485 A1* | 4/2014 | Wegener | ............. H03M 7/3079 |
| | | | 714/E11.178 |

OTHER PUBLICATIONS

Will, B. et al, "Intel® QuickAssist Technology &OpenSSL-1.1.0: Performance" Network Security Content Delivery Networks, Web Servers, Load Balancing, Intel, 2017 (12 pages).

* cited by examiner

*Primary Examiner* — Asghar H Bilgrami
(74) *Attorney, Agent, or Firm* — Chamberlain, Hrdlicka, White, Williams & Aughtry

(57) ABSTRACT

Embodiments of the present disclosure provide a method, electronic device and a computer program product for processing data. The method comprises determining target data that are used for determining a target compression level for a user. The method also comprises compressing at least part of the target data using a plurality of compression levels of a compression algorithm, respectively, to obtain a plurality of compression ratios and a plurality of compression latencies corresponding to the plurality of compression levels. The method further comprises determining the target compression level for the user for compressing data of the user data based on the plurality of compression ratios and the plurality of compression latencies.

20 Claims, 4 Drawing Sheets

METHOD, ELECTRONIC DEVICE AND COMPUTER PROGRAM PRODUCT FOR PROCESSING DATA

CROSS-REFERENCE TO RELATED APPLICATIONS

This application claims priority to Chinese Application No. 201911052498.5 filed on Oct. 31, 2019. Chinese Application No. 201911052498.5 is hereby incorporated by reference in its entirety.

FIELD

Embodiments of the present disclosure generally relate to the field of computers, and more specifically, to a method, electronic device and computer program product for processing data.

BACKGROUND

With the rapid development of computer technology, the number of computer applications has increased rapidly. As a result, the amount of data to be processed by computer applications has also increased a rapidly. Often, processed data or new data generated needs to be saved for users to re-read and obtain. Therefore, many storage devices are commonly used to store/back up various data.

In order to store/backup various data, the computing device responsible for storage usually compresses the obtained data. Through compression processing, the storage space occupied by the data to be stored will be smaller, thereby saving the storage resources occupied. If a user needs to retrieve the compressed data again, the computing device decompresses the compressed data to regenerate the data. However, there are still many problems to be solved in the process of data compression and storage.

SUMMARY

Embodiments of the present disclosure provide a method, electronic device and computer program product for processing data.

In accordance with the first aspect of the present application, it provides a processing data method. The method comprises determining target data that are used for determining a target compression level for a user. The method also comprises compressing at least part of the target data using a plurality of compression levels of a compression algorithm, respectively, to obtain a plurality of compression ratios and a plurality of compression latencies corresponding to the plurality of compression levels. The method further comprises determining the target compression level for the user for compressing data of the user based on the plurality of compression ratios and the plurality of compression latencies.

In accordance with the second aspect of the present application, it provides an electronic device. The electronic device comprising: a processor; and a memory storing computer program instructions, the processor executing the computer program instructions in the memory to control the electronic device to perform acts comprises: determining target data that are used for determining a target compression level for a user; compressing at least part of the target data using a plurality of compression levels of a compression algorithm, respectively, to obtain a plurality of compression ratios and a plurality of compression latencies corresponding to the plurality of compression levels; determining the target compression level for the user for compressing data of the user based on the plurality of compression ratios and the plurality of compression latencies.

In accordance with the third aspect of the present application, it provides a computer program product tangibly stored on a non-transitory computer-readable medium and comprising machine-executable instructions that, when executed, cause the machine to perform the method according to the first aspect.

BRIEF DESCRIPTION OF THE DRAWINGS

Through the following detailed description with reference to the accompanying drawings, the above and other objectives, features, and advantages of example embodiments of the present disclosure will become more apparent. In the exemplary embodiments of the present disclosure, the same reference numerals generally denote the same components.

In the drawings, the same or corresponding reference numerals represent the same or corresponding parts.

DETAILED DESCRIPTION OF EMBODIMENTS

Figure 1:
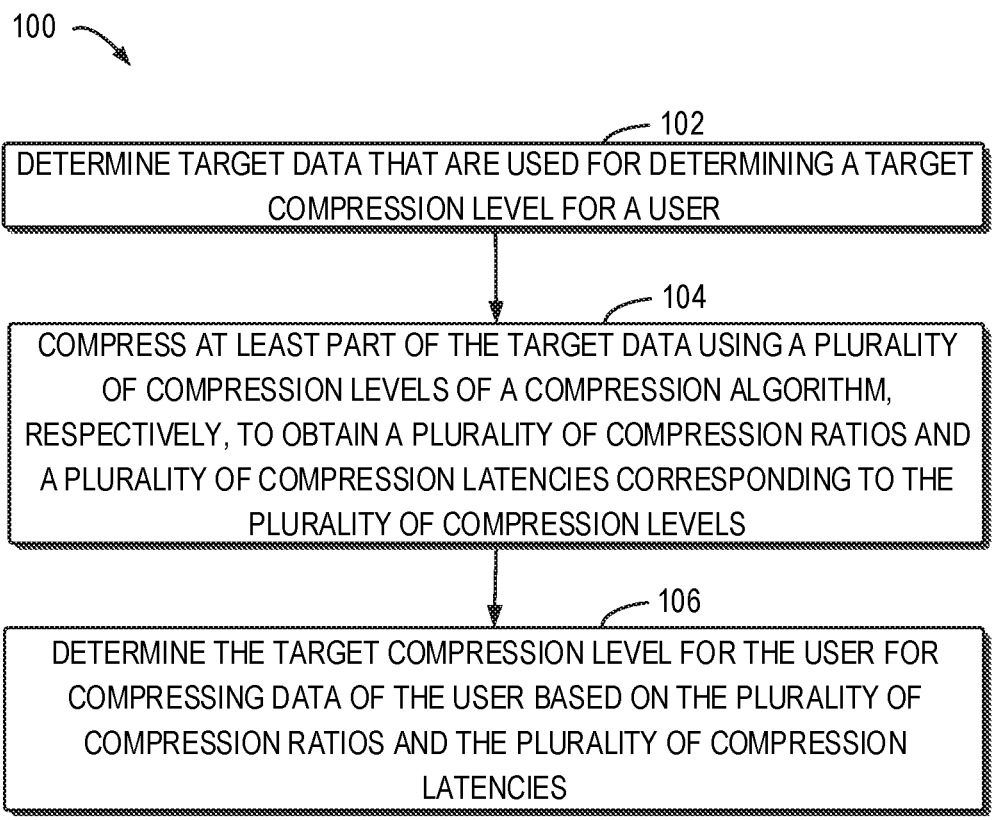
FIG. 1 is a flowchart illustrating a method 100 for processing data according to an embodiment of the present disclosure.

Embodiments of the present disclosure will be described in more detail below with reference to the accompanying drawings. While some embodiments of the present invention have been shown in the drawings, it should be understood that the present disclosure may be embodied in various forms and is not limited by the embodiments set forth herein. Rather, the embodiments are provided so that this disclosure will be thorough and complete. It should be understood that the drawings and embodiments of the present disclosure are for exemplary purposes only and are not intended to limit the protection scope of the present disclosure.

As used herein, the term "includes" and its variants are to be read as open-ended terms that mean "includes, but is not limited to." The term "based on" is to be read as "based at least in part on." The term "one example embodiment" and "an example embodiment" are to be read as "at least one example embodiment." The terms "first," "second," and the like may refer to different or identical objects. Other explicit and implicit definitions may be included below.

The principles of the present disclosure will be described below with reference to several example embodiments shown in the accompanying drawings. While the preferred embodiments of the present invention have been shown in the drawings, it should be understood that the embodiments are provided so that this disclosure will be thorough and complete and the embodiments are not intended to limit the protection scope of the present disclosure.

Compression techniques (like LZ, Huffmon coding) are widely used in data protection. By using different compression levels of a compression algorithm, different compression ratios can be obtained. Usually, higher compression levels correspond to higher compression ratios, but a higher compression ratio takes more computing resources and may introduce higher latency. When performing high compression level compression operations, QAT (Intel Quick Assist Technology) may be used to accelerate the compression tasks. In contrast, lower-level compression requires less computing resources and introduces less latency.

When storing or backing up data, data is usually compressed according to the predetermined compression level and the compression level cannot be distinguished for different users. In certain scenarios, there may be little difference of compression ratios between different compression levels. However, there is a big gap in the utilization and latency of compression resources for different compression levels. For such data, it does not make sense to employ a compression algorithm with a high compression level, and it also results in wasted resources and time.

To address at least the above problems, the present disclosure proposes a method for processing data. In this method, a target compression level is determined for a user by using the target data of the user. In a process of determining the compression level, at least part of the target data is compressed using a plurality of compression levels of a compression algorithm to obtain a plurality of compression ratios and a plurality of compression latencies corresponding to the plurality of compression levels. Then, a target compression level is determined for the user based on a plurality of compression ratios and a plurality of compression latencies, so that the user can compress the data of the user based on the target compression level. With this method, different compression levels can be adopted for different users. Therefore, the compression resources of the computing device can be used reasonably and thereby the utilization of compression resources and the compression latency are reduced and the processing efficiency is improved.

Embodiments of the present disclosure may be performed within a computing device for determining a target compression level for a user. Computing devices include, but are not limited to, personal computers, server computers, handheld or laptop devices, mobile devices (such as mobile phones, personal digital assistants (PDAs), media players, etc.), multiprocessor systems, consumer electronics, small computers, a mainframe computer, a distributed computing environment including any of the above systems or equipment, and so on.

The computing device receives the target data and then stores the target data in the internal memory of the computing device. The target data is used to determine a target compression level for a user.

Computing devices include processing units. The processing unit may include a hardware processor including, but not limited to, a hardware central processing unit (CPU), a field programmable gate array (FPGA), a compound programmable logic device (CPLD), an application specific integrated circuit (ASIC), and a system on chip (SoC)) or a combination thereof.

The processing unit of a computing device can execute a compression algorithm. The compression algorithm has a plurality of different compression levels.

In some embodiments, upon receiving the data to be compressed from the user, the computing device first determines whether there is a target compression level corresponding to the user. If there is no a target compression level, the received data to be compressed is determined as the target data that are used for determining a target compression level for the user. If a target compression exists, the existing target compression level can be directly used to compress the data. Even if there is a target compression level for the user, if a predetermined time has elapsed after the target compression level is determined, the received data to be compressed is determined as the target data for re-determining the target compression level.

In some embodiments, the target data is historical data of the user, for example, previously stored data of a user. When the target data is historical data, the computing device may use the historical data to calculate a target compression level for the user.

Compression algorithms are used to compress target data in computing devices. The compression algorithm has a plurality of compression levels. For example, the compression algorithm is LZ, Huffmon coding algorithm. In some embodiments, the compression algorithm has different static compression levels and different dynamic compression levels. The higher the compression level of a compression algorithm, the higher the degree of compression of the compressed data and the longer the compression latency.

Different compression levels of compression algorithm are used to compress the target data. Then the compressed data is analyzed to determine a plurality of compression ratios and compression latencies for different compression levels: the first compression ratio and the first compression latency, the second compression ratio and the second compression latency, and the Nth compression ratio and Nth compression latency, N is a positive integer greater than 1.

In some embodiments, when compressing the target data, usually only two compression levels of the compression algorithm are selected to compress the data. For example, the highest and lowest compression levels.

In some embodiments, when the target data is the received data to be compressed, a compression algorithm is used to perform compression processing on a part of the received data. For example, different compression levels are used to separately process the received data for a predetermined duration. For example, 5 minutes.

Then, a target compression level for a user is determined by comparing a plurality of compression ratios with a plurality of compression latencies. If the ratio of the compression ratio obtained using a high compression level to the compression ratio obtained using a low compression level exceeds a threshold value, it means that the high compression level can save more space than the low compression level. Therefore, the user can be determined to have a high compression level. If the ratio of the compression ratio obtained using a high compression level to the compression ratio obtained using a low compression level does not exceed the threshold, then the target compression level is determined according to the ratio of the compression latency.

Because the user's data is usually similar, after determining the target compression level for the user, the target compression level is used to compress data from the user.

In some embodiments, when the target data is data to be compressed, the computing device uses the determined target compression level to compress the data to be compressed. The computing device then stores the compressed data in a storage device.

In some embodiments, when the target data is historical data, the computing device may utilize the determined target compression level to compress user data received later or provide the target compression level for the user to other computing devices.

A flowchart of a method 100 for processing data will be described in detail below with reference to FIG. 1. For example, the method 100 may be performed by a computing device for determining a target compression level for a user. It should be understood that the method 100 may also include additional actions not shown and/or omits the actions shown. The scope of the present disclosure is not limited in this regard.

At block 102, the computing device determines target data that are used for determining a target compression level for a user. When determining a target compression level for a use, the target data for the user needs to be determined.

In some embodiments, the computing device receives a request from a user for storing data to be compressed. The request includes the user's identity. Then according to the request, whether a target compression level corresponding to the user is available for a compression algorithm is determined. For example, whether a target compression level corresponding to a user's identity can be found in a computing device by using the user's identity. If found, it indicates that there is the target compression level corresponding to the user.

If there is a target compression level corresponding to the user in the computing device, the target compression level is directly used to compress data. If it is determined that there is no the target compression level, the data to be compressed is determined as target data.

In some embodiments, the computing device obtains historical data related to the user. The historical data is stored by a previous user. At this time, the historical data is determined as target data for determining a target compression level for the user. When the historical data is used to determine the target compression level for the user, the operation process can be performed offline.

At block 104, the computing device uses a plurality of compression levels of the compression algorithm, respectively, to compress at least part of the target data to obtain a plurality of compression ratios and compression latencies corresponding to the plurality of compression levels, respectively.

When processing data, at least part of the target data can be compressed using different compression levels of the compression algorithm. In some embodiments, the target data is the data to be compressed. Different levels of the compression algorithm may be used to separately compress a part of the data to be compressed for a predetermined time length, such as 5 minutes. In some implementations, the target data is historical data, all the historical data may be compressed or the historical data may be compressed for a predetermined time length.

In some embodiments, two compression levels may be used to compress the target data, for example, the highest and lowest compression levels.

At block 106, the computing device determines a target compression level for the user to compress data of the user based on the plurality of compression ratios and a plurality of compression latencies. The computing device determines a target compression level for the user based on a plurality of compression ratios and a plurality of compression latencies directed for a plurality of compression levels. After obtaining the target compression level directed for the user, the target compression level is used to compress data of the user.

In some implementations, the target data is the data to be compressed from the user. After determining the target compression level for the user, a compression algorithm associated with the determined target compression level is used to compress the data to be compressed for storage.

With the above methods, different compression levels can be determined for different users. This makes it possible to use the compression resources of the computing device reasonably when processing data for a user, reducing waste of compression resources, making the compression latency more reasonable and improving the processing efficiency.

The flowchart of the method 100 for processing data is described above with reference to FIG. 1. A flowchart of a method 200 for processing data is described below with reference to FIG. 2. The method 200 for processing data is a specific example of the method 100.

Figure 2:
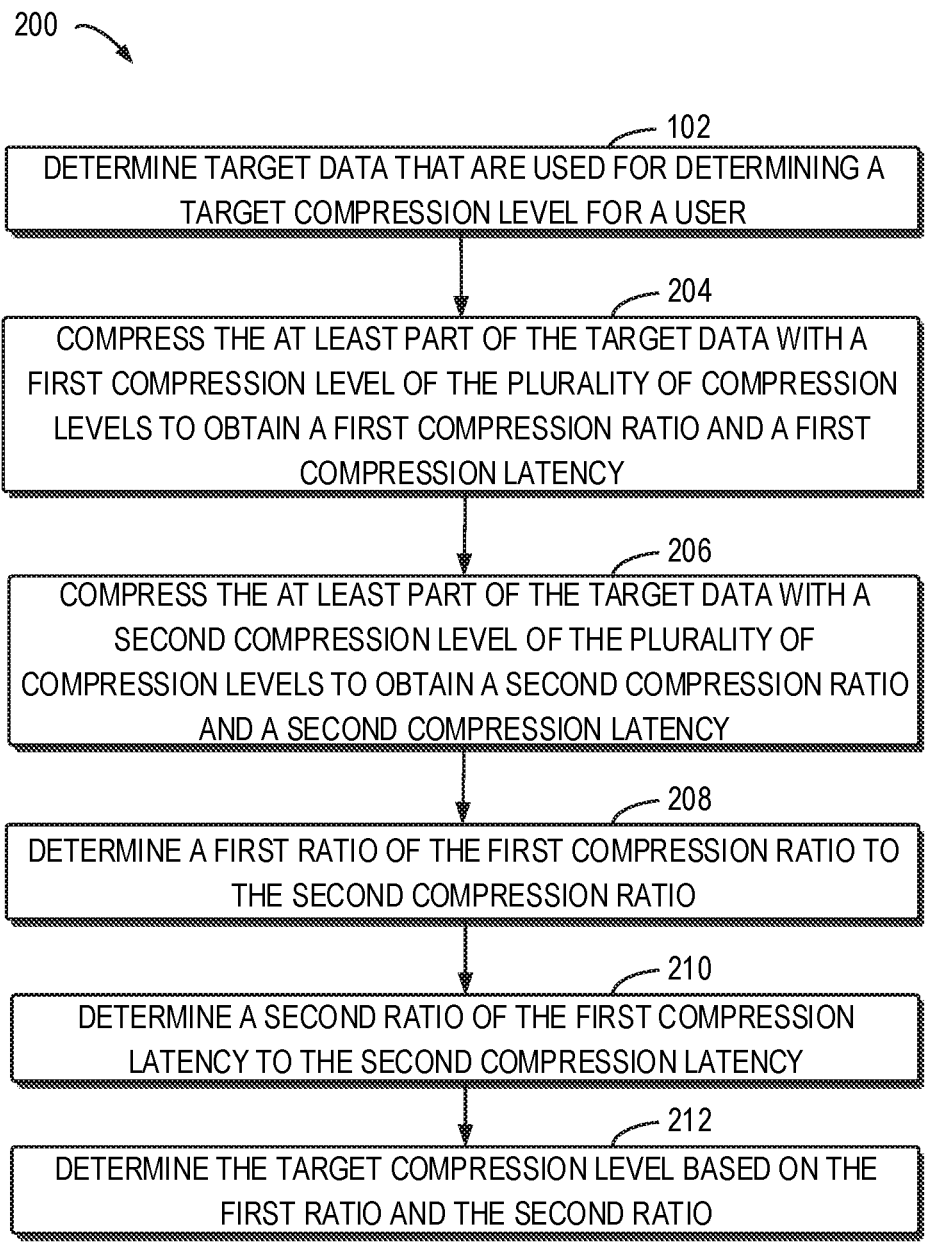
FIG. 2 is a flowchart illustrating a method 200 for processing data according to an embodiment of the present disclosure.

The content described in block 102 in the method 200 of FIG. 2 is the same as that described in block 102 in the method 100 of FIG. 1, which will not be described in detail here.

At block 204, the computing device compresses at least part of the target data with a first compression level of a plurality of compression levels to obtain a first compression ratio and a first compression latency. In some embodiments, the first compression level is the lowest compression level of the compression algorithm. The computing device uses the lowest compression level of the compression algorithm to compress at least part of the target data.

The computing device analyzes at least part of the compressed data to determine a first compression ratio and a first compression latency for the first compression level.

At block 206, the computing device compresses at least part of the target data with a second compression level of a plurality of compression levels to obtain a second compression ratio and a second compression latency, wherein the compression degree of the first compression level is lower than that of the second compression level. In some embodiments, the second compression level is the highest compression level of the compression algorithm. The computing device uses a compression algorithm with the highest compression level to compress at least part of the target data.

The computing device analyzes at least part of the compressed data to determine a second compression ratio and a second compression latency for the second compression level.

At block 208, the computing device determines a first ratio of the first compression ratio to the second compression ratio. In some embodiments, the computing device may obtain the first ratio by dividing the first compression ratio by the second compression ratio. In some embodiments, the computing device may obtain the first ratio by dividing the second compression ratio by the first compression ratio. The above examples are only used to describe the present disclosure, but not to specifically limit the present disclosure. Those skilled in the art may set the first ratio as required.

At block 210, a second ratio of the first compression latency to the second compression latency is determined. In some embodiments, the computing device divides the first compression latency by the second compression latency to obtain a second ratio. In some embodiments, the computing device divides the second compression latency by the first compression latency to obtain a second ratio. The above examples are only used to describe the present disclosure, but not to specifically limit the present disclosure. Those skilled in the art may set the second ratio as required.

Figure 3:
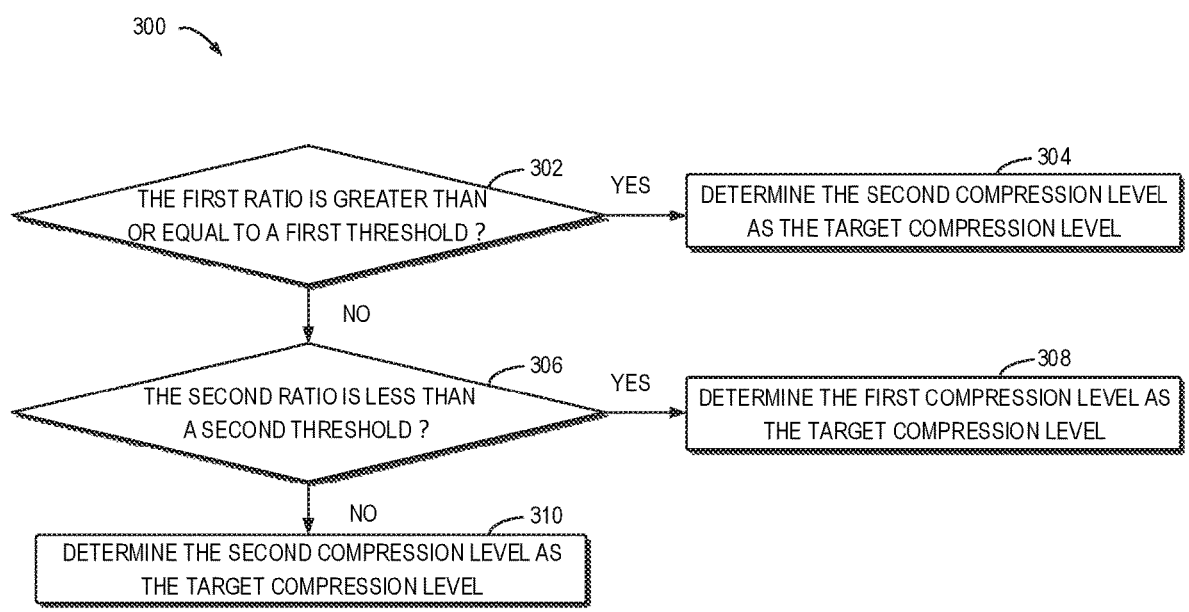
FIG. 3 is a flowchart illustrating a method 300 for determining a target compression level according to an embodiment of the present disclosure.

At block 212, the computing device determines a target compression level based on the first ratio and the second ratio. The computing device can determine, based on the first ratio and the second ratio, how much the compression rate and latency are improved between the two compression levels. The computing device then determines whether a high compression level or a low compression level corresponds to the user. An example for determining a target compression level will be described below in FIG. 3.

With the above method, the target compression level for users can be quickly determined, which improves the efficiency of determining the target compression level and saves time.

The flowchart of the method 200 for processing data is described above with reference to FIG. 2. A flowchart of a method 300 for determining a target compression level is described below with reference to FIG. 3. The method 300 for determining a target compression level is a specific example for determining a target compression level in block 212 in FIG. 2.

In this example, the first ratio is obtained by dividing the first compression ratio by the second compression ratio, and the second ratio is obtained by dividing the first compression latency by the second compression latency.

At block 302, the computing device determines whether the first ratio is greater than or equal to a first threshold. When it is determined that the first ratio is greater than or equal to the first threshold, the computing device determines the second compression level as a target compression level at block 304.

When it is determined that the first ratio is less than the first threshold, at block 306, the computing device determines whether the second ratio is less than the second threshold. Upon determining that the second ratio is less than the second threshold, the computing device determines the first compression level as a target compression level at block 308. Upon determining that the second ratio is greater than or equal to the second threshold, the computing device determines the second compression level as a target compression level at block 310.

In some embodiments, the first ratio is determined by dividing the second compression ratio by the first compression ratio. The second ratio is determined by dividing the second compression latency by the first compression latency. The first ratio and the second ratio are compared with a preset third threshold and a fourth threshold to determine a target compression level for the user. For example, if the first ratio is smaller than the third threshold, the second compression level is determined as the target compression level. If the first ratio is larger than the third threshold, it is determined whether the second ratio is larger than the fourth threshold. If the second ratio is greater than the fourth threshold, the first compression level is determined as the target compression level, otherwise the second compression level is determined as the target compression level.

The above examples are only used to describe the present disclosure, but not to specifically limit the present disclosure. Those skilled in the art can adopt a suitable threshold to determine the target compression level according to actual needs.

With the above method, the target compression level can be quickly determined through the judgment of the ratio. This makes it possible to quickly obtain the target compression level for each user, so that the compression resources can be optimally used when the user's data is compressed.

In some embodiments, the data to be compressed from the user is used to determine a target compression level for the user, and there is no target compression level corresponding to the user in the computing device.

The computing device receives the data to be compressed from the user. The computing device compresses at least part of the data to be compressed using a compression algorithm having a first compression level to generate the first compressed data. The computing device compresses at least part of the data to be compressed using a compression algorithm having a second compression level to generate the second compressed data. The first compression level is different from the second compression level. For example, the highest compression level and the lowest compression level are used to compress at least part of the data, for example, a compression time length is five minutes.

The computing device may analyze the first compressed data to determine a first compression ratio and a first compression latency. The computing device may analyze the second compressed data to determine a second compression ratio and a second compression latency.

The computing device determines a target compression level for the user based on the first compression ratio and the first compression latency and the second compression ratio and the second compression latency. The computing device then compresses all data to be compressed using the determined target compression level to generate compressed data. Finally, the computing device stores the compressed data to an external storage device.

Figure 4:
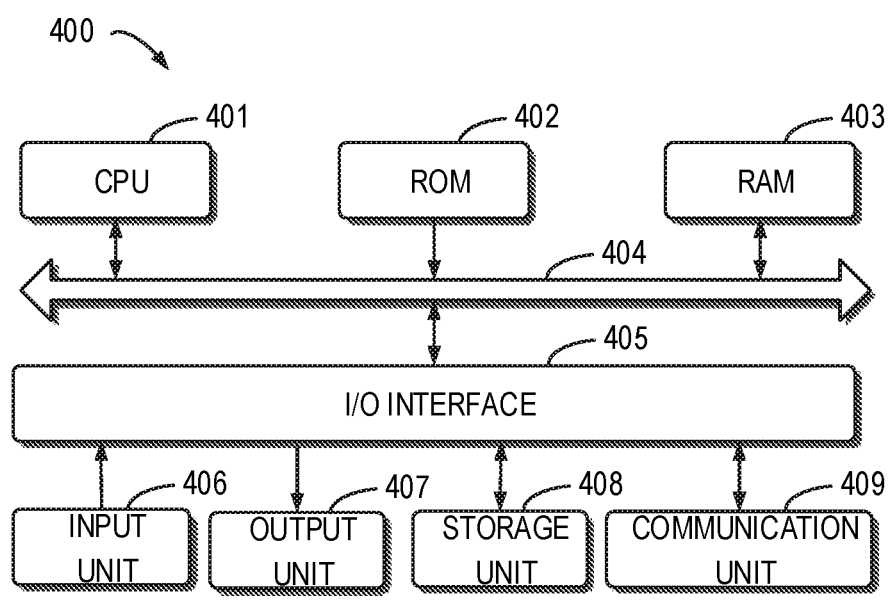
FIG. 4 is a diagram illustrating an example device 400 in which embodiments of the present disclosure herein may be implemented.

FIG. 4 is a block diagram illustrating an example device 400 used to implement embodiments of the present disclosure. For example, the computing device executing the method and embodiments of the present disclosure may be implemented by the device 400. As shown in FIG. 4 the device 400 comprises a central processing unit (CPU) 401 that may perform various appropriate actions and processing based on computer program instructions stored in a read-only memory (ROM) 402 or computer program instructions loaded from a storage section 608 to a random access memory (RAM) 403. RAM 403 further stores various programs and data needed for operations of the device 400. The CPU 401, ROM 402 and RAM 403 are connected to each other via a bus 404. An input/output (I/O) interface 405 is also connected to the bus 404.

The following components in the device 400 are connected to the I/O interface 405: an input 406 such as a keyboard, a mouse and the like; an output unit 407 including various kinds of displays and a loudspeaker, etc.; a memory unit 408 including a magnetic disk, an optical disk, and etc.; a communication unit 409 including a network card, a modem, and a wireless communication transceiver, etc. The communication unit 409 allows the device 400 to exchange information/data with other devices through a computer network such as the Internet and/or various kinds of telecommunications networks.

Various processes and processing described above, e.g., the method 100, 200 or 300 may be executed by the processing unit 401. For example, in some embodiments, the method 100, 200 or 300 may be implemented as a computer software program that is tangibly embodied on a machine-readable medium, e.g., the storage unit 408. In some embodiments, part or all of the computer programs may be loaded and/or mounted onto the device 400 via ROM 402 and/or communication unit 409. When the computer program is loaded to the RAM 403 and executed by the CPU 401, one or more steps of the method 100, 200 or 300 as described above may be executed.

The present disclosure may be a method, an apparatus, a system, and/or a computer program product. The computer program product may include a computer-readable storage medium having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable journal logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams illustrate the architecture, functionality, and operation of possible implementations of systems, methods and computer program products according to various embodiments of the present disclosure. In this regard, each block in the flowchart or block diagrams may represent a module, snippet, or portion of code, which comprises one or more executable instructions for implementing the specified journal function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A processing data method, comprises:
    determining target data that are used for determining a target compression level for a user;
    compressing at least part of the target data using a plurality of compression levels of a compression algorithm to obtain a plurality of compression ratios and a plurality of compression latencies corresponding to the plurality of compression levels; and
    determining the target compression level for the user for compressing data of the user based on the plurality of compression ratios and the plurality of compression latencies.

2. The method of claim 1, wherein determining the target data comprises:
    receiving a request from the user for storing data to be compressed;
    in response to the request, determining whether a target compression level corresponding to the user is available for the compression algorithm; and
    in response to determining that the target compression level is unavailable, determining the data to be compressed as the target data.

3. The method of claim 2, further comprising:
    compressing the data using the compression algorithm associated with the determined target compression level.

4. The method of claim 1, wherein determining the target data comprises:
    obtaining historical data related to the user; and
    determining the historical data as the target data.

5. The method of claim 1, wherein compressing at least part of the target data comprises:
    compressing the at least part of the target data with a first compression level of the plurality of compression levels to obtain a first compression ratio and a first compression latency; and
    compressing the at least part of the target data with a second compression level of the plurality of compression levels to obtain a second compression ratio and a second compression latency, wherein a compression degree for the first compression level is lower than that for the second compression level.

6. The method of claim 5, wherein determining the target compression level for the user comprises:
    determining a first ratio of the first compression ratio to the second compression ratio;
    determining a second ratio of the first compression latency to the second compression latency; and
    determining the target compression level based on the first ratio and the second ratio.

7. The method of claim 6, wherein determining the target compression level based on the first ratio and the second ratio comprises:
    determining that the first ratio is greater than or equal to a first threshold; and
    in response to the first ratio being greater than or equal to the first threshold, determining the second compression level as the target compression level.

8. The method of claim 6, wherein determining the target compression level based on the first ratio and the second ratio comprises:
    in response to the first ratio being is less than the first threshold, determining whether the second ratio is less than a second threshold;
    in response to the second ratio being less than the second threshold, determining the first compression level as the target compression level; and
    in response to the second ratio being greater than or equal to the second threshold, determining the second compression level as the target compression level.

9. An electronic device, comprising:
    a processor; and
    a memory storing computer program instructions, the processor executing the computer program instructions in the memory to control the electronic device to perform a method, the method comprising:
        determining target data that are used for determining a target compression level for a user;
        compressing at least part of the target data using a plurality of compression levels of a compression algorithm to obtain a plurality of compression ratios and a plurality of compression latencies corresponding to the plurality of compression levels; and
        determining the target compression level for the user for compressing data of the user based on the plurality of compression ratios and the plurality of compression latencies.

10. The electronic device of claim 9, wherein determining the target data comprising:
    receiving a request from the user for storing data to be compressed;
    in response to the request, determining whether a target compression level corresponding to the user is available for the compression algorithm; and
    in response to determining that the target compression level is unavailable, determining the data to be compressed as the target data.

11. The electronic device according to claim 10, wherein the method further comprises:
    compressing the data to be compressed for storage using the compression algorithm associated with the determined target compression level.

12. The electronic device according to claim 9, wherein determining the target data comprising:
    obtaining historical data related to the user; and
    determining the historical data as the target data.

13. The electronic device claim 9, wherein compressing at least part of the target data comprises:
    compressing the at least part of the target data with a first compression level of the plurality of compression levels to obtain a first compression ratio and a first compression latency; and
    compressing the at least part of the target data with a second compression level of the plurality of compression levels to obtain a second compression ratio and a second compression latency, wherein a compression degree for the first compression level is lower than that for the second compression level.

14. The electronic device of claim 13, wherein determining the target compression level for the user comprises:
    determining a first ratio of the first compression ratio to the second compression ratio;
    determining a second ratio of the first compression latency to the second compression latency; and
    determining the target compression level based on the first ratio and the second ratio.

15. The electronic device of claim 14, wherein determining the target compression level based on the first ratio and the second ratio comprises:
    determining that the first ratio is greater than or equal to a first threshold; and in response to the first ratio being greater than or equal to the first threshold, determining the second compression level as the target compression level.

16. The electronic device of claim 14, wherein determining the target compression level based on the first ratio and the second ratio comprises:
in response to the first ratio being is less than the first threshold, determining whether the second ratio is less than a second threshold;
in response to the second ratio being less than the second threshold, determining the first compression level as the target compression level; and
in response to the second ratio being greater than or equal to the second threshold, determining the second compression level as the target compression level.

17. A computer program product being tangibly stored on a non-volatile computer-readable medium and comprising machine-executable instructions which, when executed, cause a machine to perform steps of a method, the method comprising:
determining target data that are used for determining a target compression level for a user;
compressing at least part of the target data using a plurality of compression levels of a compression algorithm to obtain a plurality of compression ratios and a plurality of compression latencies corresponding to the plurality of compression levels; and
determining the target compression level for the user for compressing data of the user based on the plurality of compression ratios and the plurality of compression latencies.

18. The computer program product of claim 17, wherein determining the target data comprises:
receiving a request from the user for storing data to be compressed;
in response to the request, determining whether a target compression level corresponding to the user is available for the compression algorithm; and
in response to determining that the target compression level is unavailable, determining the data to be compressed as the target data.

19. The computer program product of claim 18, the method further comprising:
compressing the data using the compression algorithm associated with the determined target compression level.

20. The computer program product of claim 17, wherein compressing at least part of the target data comprises:
compressing the at least part of the target data with a first compression level of the plurality of compression levels to obtain a first compression ratio and a first compression latency; and
compressing the at least part of the target data with a second compression level of the plurality of compression levels to obtain a second compression ratio and a second compression latency, wherein a compression degree for the first compression level is lower than that for the second compression level.

* * * * *